United States Patent
Mitsumata et al.

[11] Patent Number: 6,037,773
[45] Date of Patent: Mar. 14, 2000

[54] MAGNETIC RESONANCE IMAGING APPARATUS

[75] Inventors: Hirotsugu Mitsumata, Uji; Hiroshi Inoue, Kyoto; Masato Okazaki, Ootsu; Masami Sugie, Kusatsu, all of Japan

[73] Assignee: Shimadzu Corporation, Kyoto, Japan

[21] Appl. No.: 08/889,330

[22] Filed: Jul. 8, 1997

[30] Foreign Application Priority Data

Jul. 19, 1996 [JP] Japan ................................ 8-190371(P)

[51] Int. Cl.[7] .................................................... G01V 3/00
[52] U.S. Cl. .......................... 324/318; 324/300; 324/322; 600/422
[58] Field of Search .................................. 324/300, 318, 324/322; 600/422, 424

[56] References Cited

U.S. PATENT DOCUMENTS

| | | | |
|---|---|---|---|
| 4,634,980 | 1/1987 | Misic et al. | 324/322 |
| 5,185,577 | 2/1993 | Minemura | 324/318 |
| 5,274,332 | 12/1993 | Jaskolski et al. | 324/318 |
| 5,305,750 | 4/1994 | Makita | 128/653.5 |

FOREIGN PATENT DOCUMENTS

| | | |
|---|---|---|
| 430103A2 | 6/1991 | European Pat. Off. . |
| 6-74105 | 10/1994 | Japan . |

*Primary Examiner*—Christine K. Oda
*Assistant Examiner*—Brij B. Shrivastav
*Attorney, Agent, or Firm*—Nikaido Marmelstein Murray & Oram LLP

[57] ABSTRACT

A magnetic resonance imaging apparatus has a gantry including various coils such as a static field coil and gradient field coils, a top board for supporting an examinee and moving the examinee into and out of an opening of the gantry, and an approximately cylindrical RF coil defining a hollow space therein. The RF coil is set to the top board, with an axis of the hollow space extending at an angle to the horizontal. The examinee's imaging site is inserted into the hollow space of the RF coil to have sectional images picked up. Since the RF coil is set to the top board with the axis of the hollow space inclined relative to the horizontal, sectional images may be picked up by using the approximately cylindrical RF coil while allowing the examinee to take a comfortable posture without enlarging the RF coil.

3 Claims, 9 Drawing Sheets

6,037,773

MAGNETIC RESONANCE IMAGING APPARATUS

BACKGROUND OF THE INVENTION (1) Field of the Invention

This invention relates to magnetic resonance imaging OMRI) apparatus. More particularly, the invention relates to a magnetic resonance imaging apparatus including an RF coil having an approximately cylindrical shape for picking up sectional images of predetermined sites such as the neck, head or knees.

(2) Description of the Related Art

A conventional RF coil for picking up sectional images of the head and neck is constructed as shown in FIGS. 1 and 2, for example. FIG. 1 is a view in vertical section showing a construction of a conventional RF coil and adjacent elements for picking up images of the head and neck. FIG. 2 is a view seen in a direction indicated by arrows 2—2 of FIG. 1.

A patient or examinee M is placed on a top board 100. The top board 100 is horizontally movably supported on a bed stand (not shown). Sectional images are picked up of the examinee M inserted into an opening of a gantry not shown.

A headrest 101 is mounted on the top board 100 through a headrest support 102 and a shoulder-rest 103. A predetermined space 104 is formed between the top board 100 and headrest 101.

The headrest 101 has slide rails 105 attached thereto, while an RF coil 106 for head and neck imaging has sliders 107. Thus, the RF coil 106 is slidable along the headrest 101.

The RF coil 106 has a shape of elliptical cylinder defining a hollow space 108. Cutouts 109 are formed at a proximal end (righthand end in FIG. 1) of the RF coil 106 for receiving the shoulders of examinee M.

A static magnetic field is formed in the gantry to extend on a horizontal plane. The RF coil 106 has enhanced sensitivity when adjusted to align the axis 110 of hollow space 108 to the direction of the static magnetic field. It has been conventional practice, therefore, to set the headrest 101 horizontally to the top board 100 as shown in FIG. 1, so that the axis 110 may be aligned to the horizontal. The RF coil 106 is slid horizontally along the headrest 101 maintained in such a state.

With the above construction, sectional images are picked up as follows.

First, the examinee M is laid on the top board 100, with his or her shoulders placed on the shoulder-rest 103 and the back of the head on the headrest 101 (or on a cushion 101a thereof). In this state, the RF coil 106 is slid rightward from a position shown in two-dot-and-dash lines in FIG. 1, to insert an imaging site of examinee M into the hollow space 108 of RF coil 106. Then, the top board 100 is moved horizontally to insert the imaging site into the opening of the gantry to pick up sectional images of the imaging site.

The conventional apparatus of the above construction has the following drawbacks.

When picking up sectional images of the neck, as shown in FIG. 1 for example, the RF coil 106 is set as far rightward in FIG. 1 as possible for the cutouts 109 of RF coil 106 to contact the shoulders of examinee M. This step is taken in order to position the imaging site, i.e. the neck KB, inward from the cutouts 109 since sensitivity is low adjacent the cutouts 109 which would result in poor image quality.

It is therefore necessary to fit the shoulders of examinee M into innermost ends of the cutouts 109. Conventionally, the shoulder-rest 103 is used to raise the shoulders of examinee M to the level of the innermost ends of the cutouts 109.

Consequently, during a neck image pickup operation, the examinee M is forced to take a posture arched from the head to the shoulders as shown in FIG. 1. This forced posture is uncomfortable and could be painful to the examinee M.

In such a posture, the nose and chin of the examinee M thrust upward to have only a narrow space 111 from an inner circumferential surface of RF coil 106 extending over the nose and chin of the examinee M. This gives the examinee M a sense of tightness. In the case of a large examinee M, it may be impossible to insert an imaging site (such as the head) into the hollow space 108 of RF coil 106, hence impossible to pick up sectional images.

By enlarging a dimension (cylinder diameter) of RF coil 106, for example, the examinee M may be given increased freedom for taking a more comfortable posture in the hollow space 108. However, an enlargement of RF coil 106 would result in a decrease in the sensitivity of RF coil 106, leading to poor image quality.

SUMMARY OF THE INVENTION

This invention has been made having regard to the state of the art noted above, and its object is to provide a magnetic resonance imaging apparatus for picking up sectional images of an examinee by using an RF coil having an approximately cylindrical shape, which allows the examinee to take a comfortable posture without enlarging the RF coil.

The above object is fulfilled, according to this invention, by a magnetic resonance imaging apparatus for picking up sectional images of a predetermined imaging site of an examinee, comprising a gantry including various coils such as a static field coil and gradient field coils and defining an opening for receiving the examinee, a top board for supporting the examinee and moving the examinee into and out of the opening, and an approximately cylindrical RF coil defining a hollow space therein, wherein the RF coil is set to the top board with an axis of the hollow space extending at an angle to a horizontal direction.

According to the above apparatus, which forms a first aspect of this invention, the RF coil is set to the top board with the axis of the hollow space extending at an angle to the horizontal. A predetermined imaging site of the examinee laid on the top board is inserted into the hollow space of the RF coil to have sectional images picked up. Since the RF coil has the axis of the hollow space inclined relative to the horizontal, the RF coil follows a posture of the examinee on the top board. Thus, the examinee can assume a comfortable posture for sectional image pickup. Without enlarging the RF coil, the examinee feels a reduced sense of tightness, and sectional images may be picked up of a large examinee also.

The RF coil may be fixed to the top board. However, it is preferred that the RF coil is attachable to and detachable from the top board. Then, the RF coil, when not required, may be detached from the top board to present no obstruction to imaging of other sites of the examinee, for example.

This invention is advantageous particularly when applied to an RF coil constructed for imaging the head and neck of the examinee.

In the magnetic resonance imaging apparatus in the first aspect of this invention, the RF coil may be adapted separable into a plurality of blocks to open a circumferential surface thereof. This facilitates an operation to place the examinee's predetermined imaging site in the hollow space of the RF coil before picking up sectional images thereof. That is, with the blocks of the RF coil separated, the examinee's imaging site is introduced through an opened circumferential portion and set in position inside the hollow space of the RF coil. The blocks of the RF coil are thereafter joined whereby the examinee's imaging site is placed in the hollow space of the RF coil.

Preferably, the RF coil is divided into a lower block and an upper block, the upper block being separable from the lower block set to the top board, or the upper block being separable from, while being partly connected to, the lower block set to the top board.

A magnetic resonance imaging apparatus for picking up sectional images of a predetermined imaging site of an examinee, in a second aspect of this invention, comprises a gantry including various coils such as a static field coil and gradient field coils and defining an opening for receiving the examinee, a top board for supporting the examinee and moving the examinee into and out of the opening, an approximately cylindrical RF coil defining a hollow space therein, a support member set to the top board for supporting the examinee adjacent the imaging site, and a slide device for sliding the RF coil relative to the support member along an axis of the hollow space extending at an angle to a horizontal direction.

According to the apparatus in the second aspect of the invention, when picking up sectional images, the support member is set to the top board, and the examinee is placed to be supported adjacent the imaging site thereof by the support member. Then, the RF coil is slid axially along the support member to insert the imaging site into the hollow space of the RF coil. This sliding movement is made with the axis of the hollow space of the RF coil inclined relative to the horizontal. Therefore, the sliding direction is inclined relative to the horizontal. As in the apparatus in the fist aspect of the invention, the examinee can assume a comfortable posture for sectional image pickup. Without enlarging the RF coil, the examinee feels a reduced sense of tightness, and sectional images may be picked up of a large examinee also. After sectional images are acquired, the RF coil is slid along the support member to expose the examinee's imaging site from the hollow space of the RF coil. Thus, with the RF coil arranged slidable axially along the support member, the examinee's imaging site may be inserted into the hollow space of the RF coil with ease.

The support member and RF coil may be fixed to the top board. However, it is preferred that the support member and RF coil are attachable to and detachable from the top board. Then, the support member and RF coil, when not required, may be detached from the top board to present no obstruction to imaging of other sites of the examinee, for example.

This invention is advantageous particularly when applied to an RF coil constructed for imaging the head and neck of the examinee.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

Figure 3:
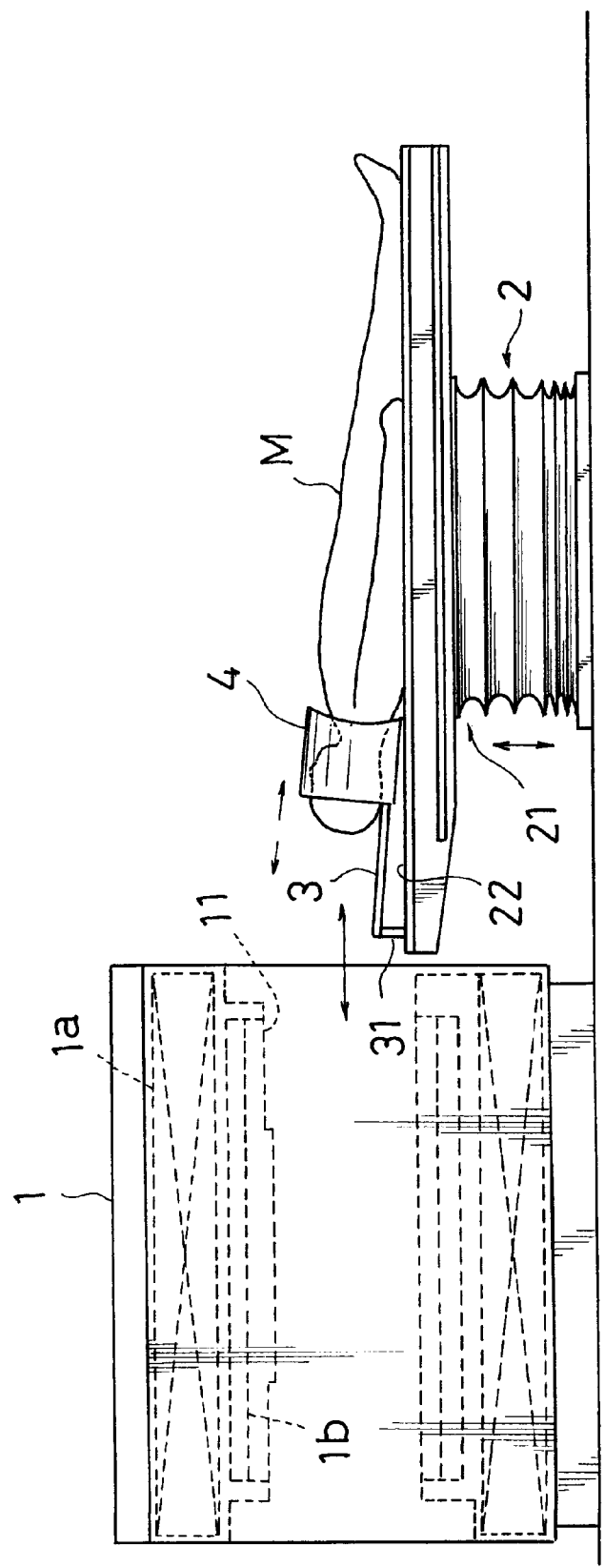
FIG. 3 is a front view of an entire magnetic resonance imaging apparatus according to this invention.

As shown in FIG. 3, a magnetic resonance imaging (MRI) apparatus includes a gantry 1, a bed 2, a headrest 3 acting as a support member, and an RF coil 4 for picking up sectional images of the head and neck.

The gantry 1 has various coils such as a static field coil 1a and gradient field coils 1b arranged therein, as well as an opening 11 for receiving an examinee M in time of image pickup.

The bed 2 has a vertically movable bed stand 21, and a top board 22 horizontally slidably mounted on the bed stand 21 for supporting the examinee M.

Figure 4:
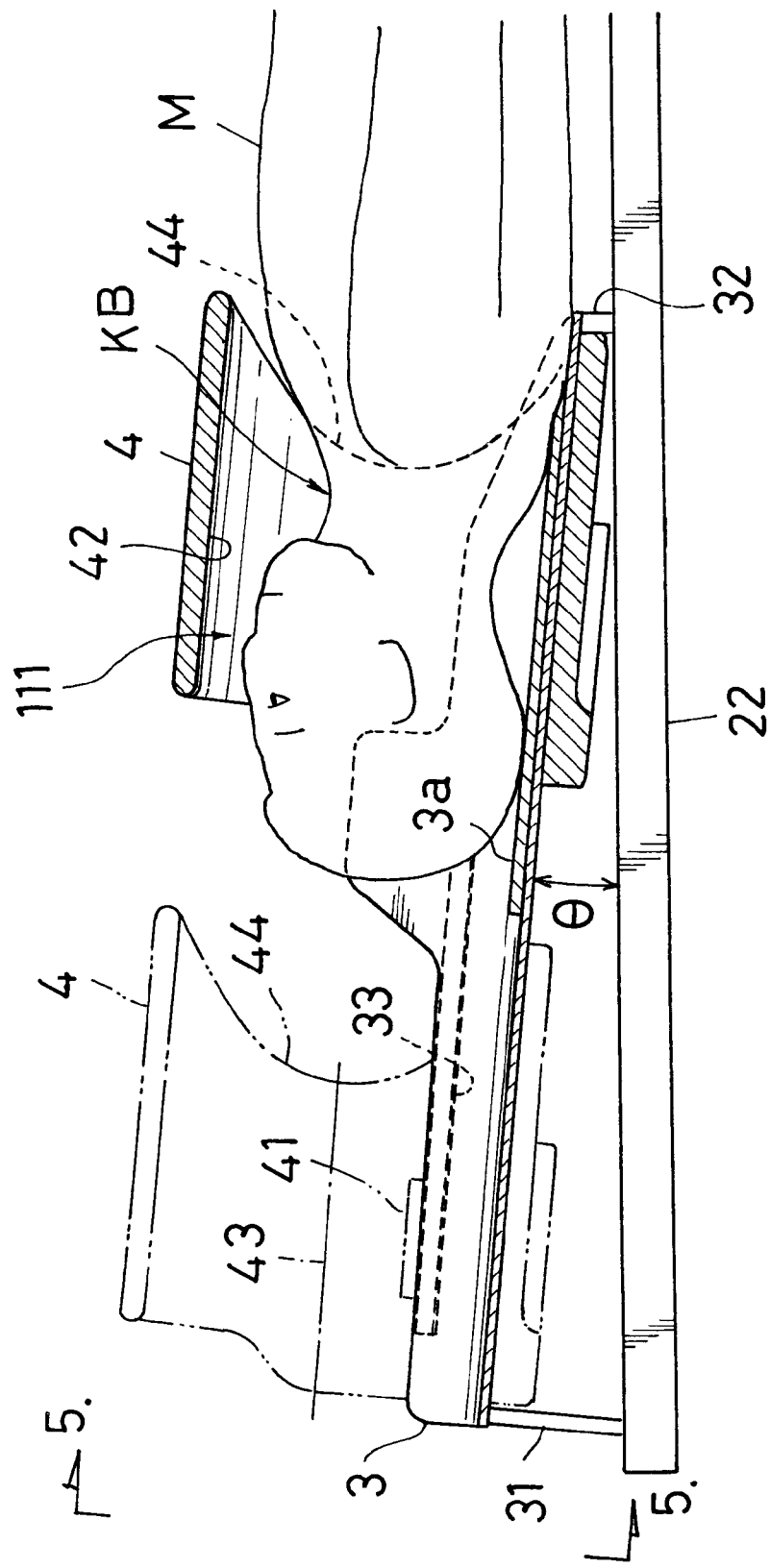
FIG. 4 is a view in vertical section of a principal portion of the apparatus according to this invention.
Figure 5:
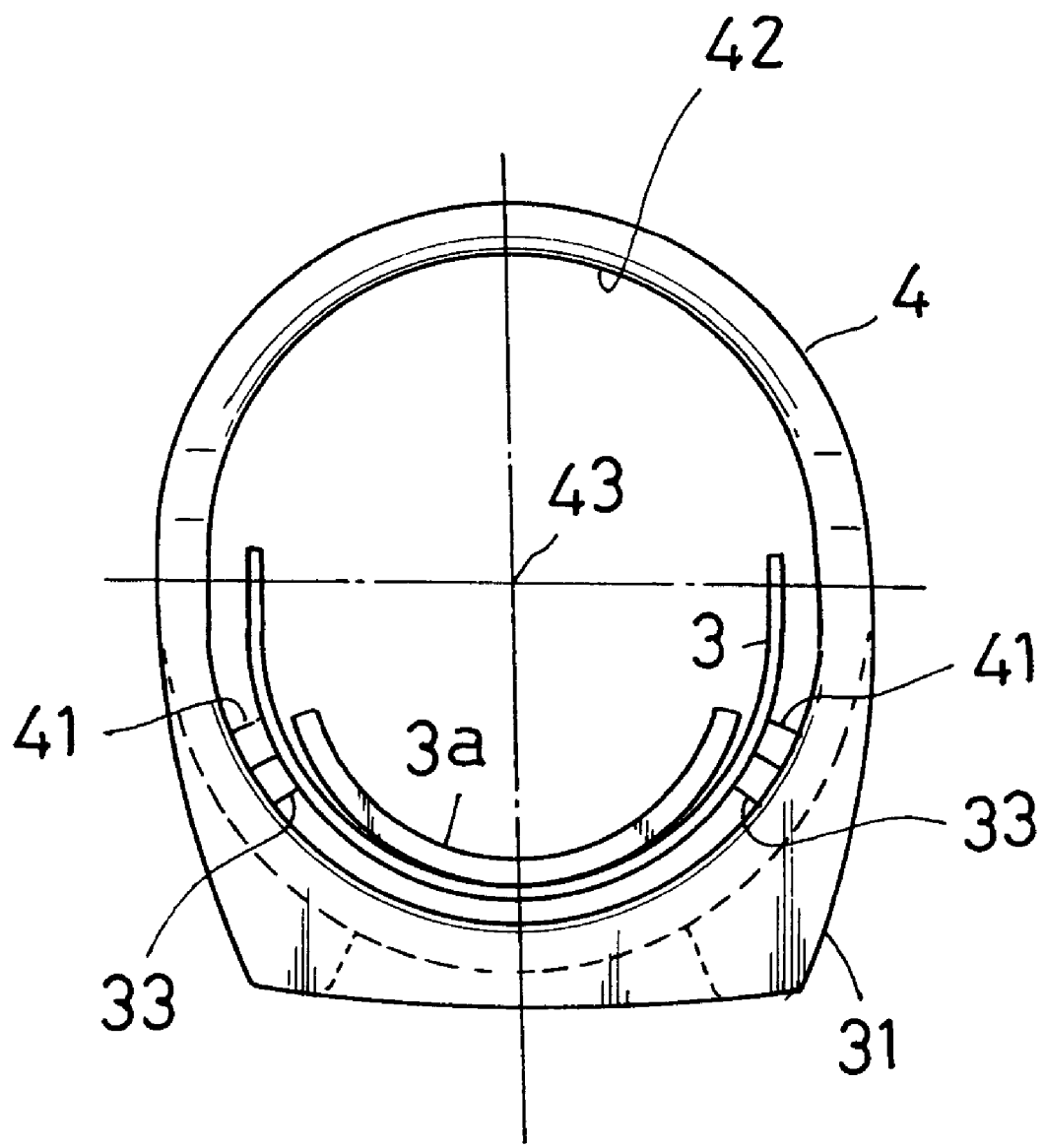
FIG. 5 is a view seen in a direction indicated by arrows 5—5 of FIG. 4.

As shown in FIGS. 3 through 5, the headrest 3 has a long headrest support 31 and a short headrest support 32 attached to longitudinally opposite ends thereof. The headrest 3 is detachably set to the top board 22 through these long and short headrest supports 31 and 32 to form an angle θ to the horizontal.

The headrest 3 may be set to the top board 22 simply by placing the headrest supports 31 and 32 in predetermined positions on the top board 22. However, the long and short headrest supports 31 and 32 should preferably be fixed to some degree to predetermined positions on the top board 22 with adhesive tape or the like.

In this embodiment, the above inclination angle θ is approximately 6 degrees. The headrest 3 has a pair of slide rails 33 attached to extend longitudinally thereof (in a direction at angle θ to the horizontal).

The RF coil 4 has a pair of sliders 41 attached thereto. The sliders 41 are slidable along the respective slide rails 33 to slide the RF coil 4 along the headrest 3. Consequently, the RF coil 41 is slidable in the direction inclined by angle θ to the horizontal. The RF coil 41 is mounted on the top board 22, with axis 43 of a hollow space 42 thereof extending at angle θ to the horizontal. The construction of RF coil 4 itself is the same as in the prior art; it has a shape of elliptical cylinder defining the hollow space 42, with cutouts 44 formed at a proximal end thereof (righthand end in FIG. 4) for receiving the shoulders of examinee M.

With the above construction, sectional images are picked up as follows.

First, the headrest 3 and RF coil 4 are set to the top board 22 at angle θ to the horizontal as shown in FIGS. 3 and 4.

Next, the examinee M is laid on the top board 22, with the back of his or her head placed on the headrest 3 (or on a cushion 3a thereof). In this state, the RF coil 4 is slid rightward and downward from a position shown in two-dot-and-dash lines to a position shown in solid lines in FIG. 4, to insert an imaging site of examinee M into the hollow space 42 of RF coil 4 (see FIG. 3). Then, the top board 22 is moved horizontally to insert the imaging site into the opening 11 of the gantry 1. The imaging site is positioned centrally of an imaging space inside the opening 11 to pick up sectional images of the imaging site.

After the sectional images are acquired, the top board 22 is slid in the opposite direction (rightward in FIG. 3) to withdraw the examinee M from the opening 11 of gantry 1. Next, RF coil 4 is slid leftward and upward to the position shown in the two-dot-and-dash lines in FIG. 4, and the examinee M is removed from the top board 22. The headrest 3 and RF coil 4, if not required for a next image pickup operation, are detached from the top board 22.

When picking up sectional images of the neck, as shown in FIG. 4 for example, the RF coil 4 is set as far rightward in FIG. 4 as possible for the cutouts 44 of RF coil 4 to contact the shoulders of examinee M. That is, the shoulders of examinee M are fitted into innermost ends of the cutouts 44. In this embodiment, the RF coil 4 is set to the top board 22 in a way to follow the posture of examinee M. There is no need to raise the shoulders of examinee M to the level of the inner-most ends of the cutouts 44, as required in the prior art. It will be seen from a comparison between FIG. 4 and FIG. 1 that the examinee M inserted into the hollow space 42 of RF coil 4 assumes a far more comfortable posture in this embodiment (FIG. 4). That is, this invention allows the examinee M to remain in a comfortable posture during an image pickup operation without enlarging the RF coil.

Figure 1:
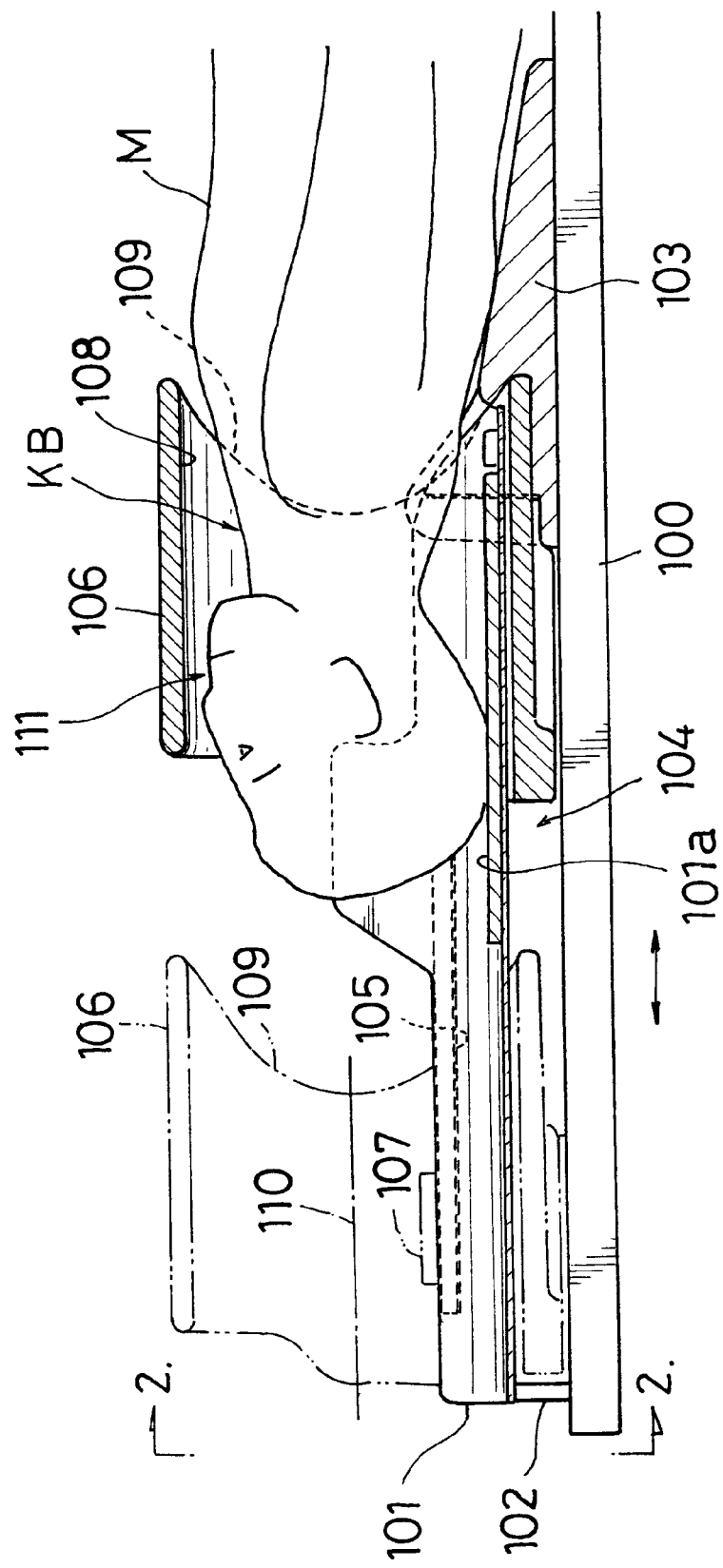
FIG. 1 is a view in vertical section showing a construction of a conventional RF coil and adjacent elements for picking up images of the head and neck.
Figure 2:
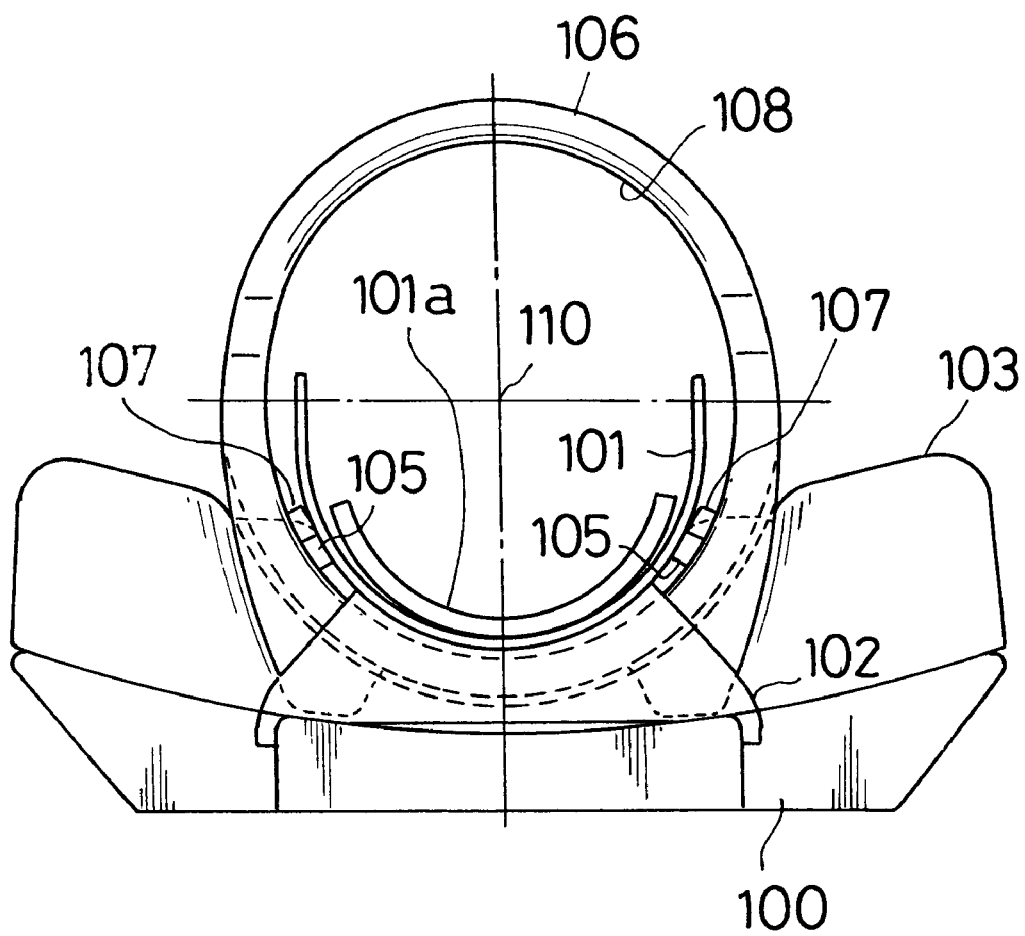
FIG. 2 is a view seen in a direction indicated by arrows 2—2 of FIG. 1.

A comparison between FIG. 4 and FIG. 1 will show clearly that the space 111 between the nose and chin of the examinee M and the inner circumferential surface of RF coil 4 extending over the nose and chin of the examinee M is larger in this embodiment (FIG. 4) than the corresponding space 111 in FIG. 1. This diminishes the sense of tightness felt by the examinee M, and enables sectional images to be picked up of a large examinee M.

Furthermore, this embodiment does not require a shoulder-rest, which simplifies the construction compared with the conventional apparatus, and the apparatus in this embodiment is the less expensive for omission of the shoulder-rest. The headrest 3 and RF coil 4 may be attached to and detached from the top board 22, and may be carried, the more easily for omission of the shoulder-rest.

The RF coil 4 receives a reduced amount of signals since the axis 43 of the hollow space 42 of RF coil 4 is inclined relative to the horizontal. However, the amount of signals in this embodiment is cos θ (θ=60°)=0.994, compared with the case of the axis 43 of the hollow space 42 of RF coil 4 extending horizontally. This is a reduction of no more than 0.6%, which is hardly problematic for practical purposes.

In the foregoing embodiment, the RF coil 4 is constructed to be slidable relative to the headrest 3. As shown in FIGS. 6 Although 6C, for example, RF coil 4 may be set to the top board 22 simply (i.e. not to be slidable) with the axis 43 of the hollow space 42 thereof inclined relative to the horizontal.

Figure 6A:
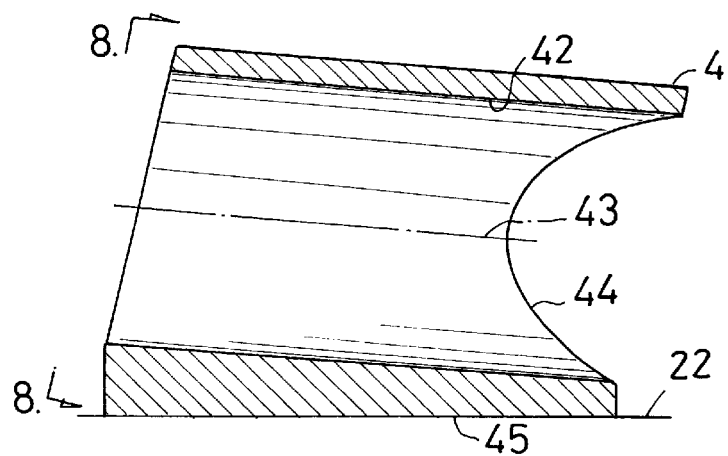
FIGS. 6A through 6C are side views showing examples of setting an RF coil to a top board with the axis of a hollow space in the RF coil extending at an angle to the horizontal.

In the construction shown in FIG. 6A, the RF coil 4 defines a hollow space 42 having an axis 43 thereof extending at an angle to a bottom 45 of RF coil 4. Thus, with the bottom 45 of RF coil 4 set to the top board 22, the axis 43 of the hollow space 42 is inclined relative to the horizontal.

Figure 6B:
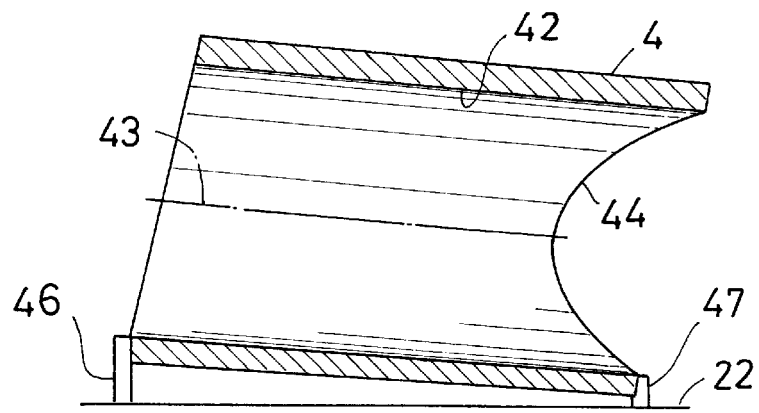

In the construction shown in FIG. 6B, long and short RF coil supports 46 and 47 are attached to the RF coil 4 and set to the top board 22. As a result, the RF coil 4 is set to the top board 22, with the axis 43 of the hollow space 42 inclined to the horizontal.

Figure 6C:
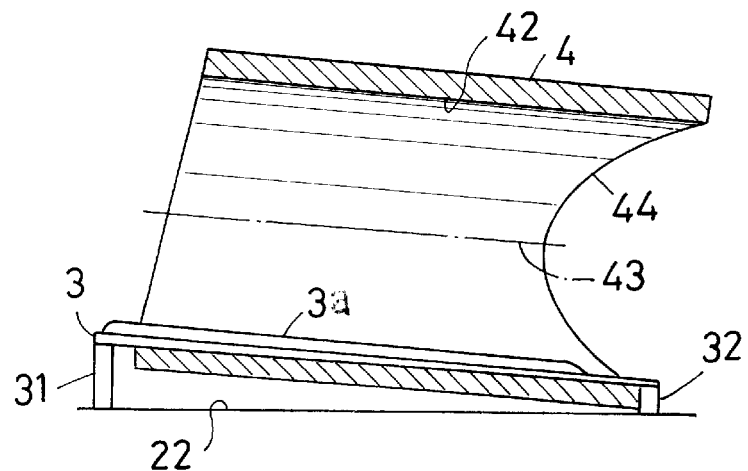

In the construction shown in FIG. 6C, the headrest 3 has a longitudinal dimension approximately corresponding to the length of RF coil 4 along the axis 43 of the hollow space 42. The headrest 3 includes long and short headrest supports 31 and 32, with the slide rails 33 and sliders 41 omitted. By setting the long and short headrest supports 31 and 32 to the top board 22, the RF coil 4 is set to the top board 22 through the headrest 3, with the axis 43 of the hollow space 42 inclined relative to the horizontal.

The RF coil 4 or RF coil supports 46 and 47 may be set to the top board 22 simply by placing the RF coil 4 or RF coil supports 46 and 47 in predetermined positions on the top board 22. However, the RF coil 4 or RF coil supports 46 and 47 should preferably be fixed to some degree to predetermined positions on the top board 22 with adhesive tape or the like.

In the constructions shown in FIGS. 6A through 6C, the examinee M is to be slid in through one end opening of the hollow space 42 of RF coil 4 when placing an imaging site of examinee M in the hollow space 42. This operation may be difficult and painful to the examinee M.

Where the constructions shown in FIGS. 6A through 6C are employed (in which RF coil 4 is not slidable relative to the headrest 3), the RF coil 4 may be arranged separable into two or more blocks as shown in FIGS. 7A through 7D, FIGS. 8A and 8B and FIGS. 9A and 9B (which show examples of separation into two blocks, i.e. lower block 4a and upper block 4b), to open a circumferential surface of RF coil 4. FIGS. 7A through 7D, FIGS. 8A and 8B and FIGS. 9A and 9B exemplify the RF coil 4 shown in FIG. 6A, but the illustrated split constructions are applicable also to the constructions shown in FIGS. 6B and 6C. FIGS. 7B, 7D, 8A and 8B are views seen in the direction indicated by arrows 8—8 of FIG. 6A.

Figure 7A:
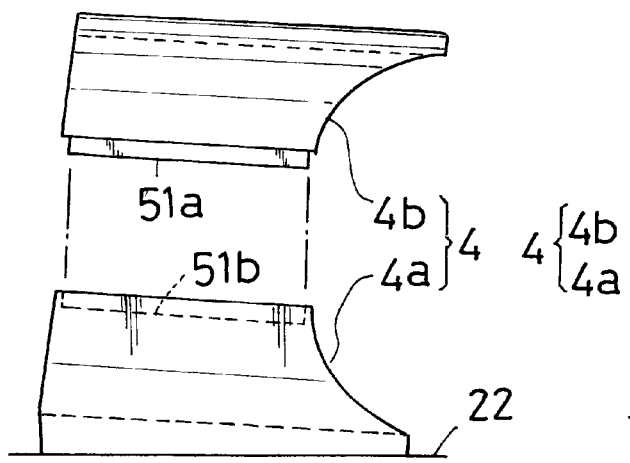
FIGS. 7A through 7D are views showing an example of RF coil separable into two or more blocks to open a circumferential surface of the RF coil.
Figure 7B:
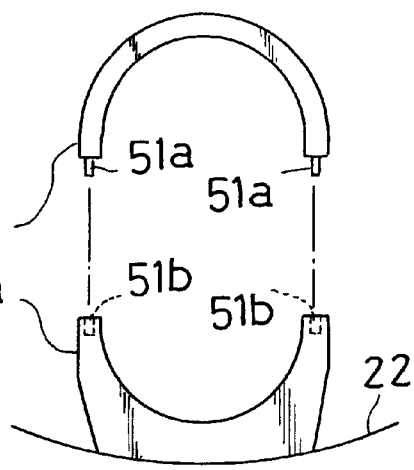
Figure 7C:
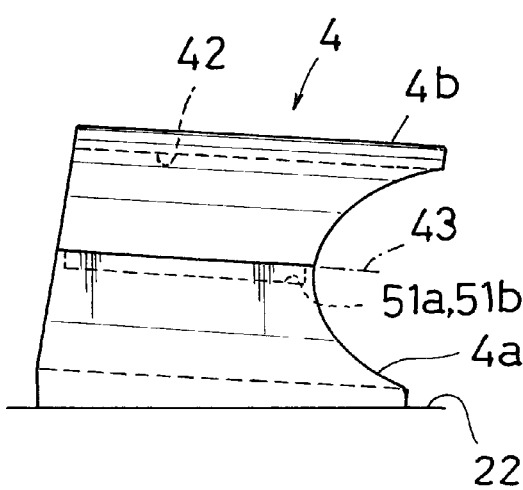
Figure 7D:
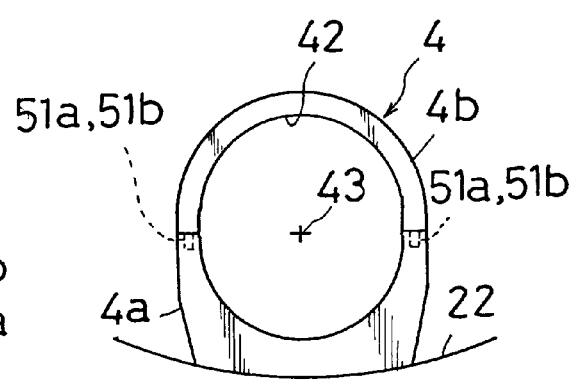

In the construction shown in FIGS. 7A through 7D, an upper block 4b is completely separable from a lower block 4a set to the top board 22 as shown in FIGS. 7A and 7B. The upper block 4b may be joined with the lower block 4a set on the top board 22 as shown in FIGS. 7C and 7D. A hollow space 42 is formed when the upper and lower blocks 4b and 4a are joined. When the upper and lower blocks 4b and 4a are separated, the coil in the lower block 4a and that in the upper block 4b are electrically disconnected. The lower block 4a and upper block 4b include connectors 51a and 51b arranged at respective joints. When the lower block 4a and upper block 4b are joined, these connectors 51a and 51b fit each other to electrically connect the coil in the lower block 4a and that in the upper block 4b.

Figure 8A:
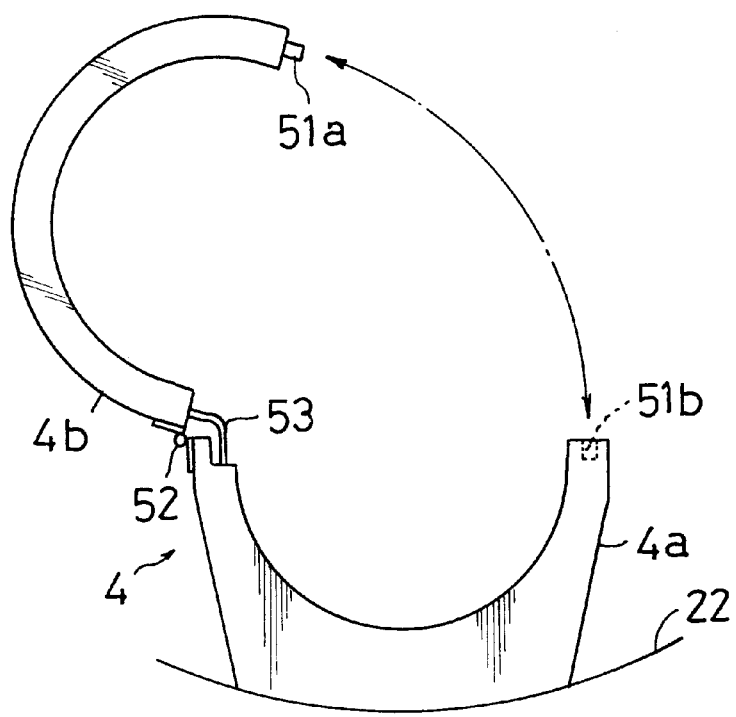
FIGS. 8A and 8B are views showing another example of RF coil separable into two or more blocks to open a circumferential surface of the RF coil.
Figure 8B:
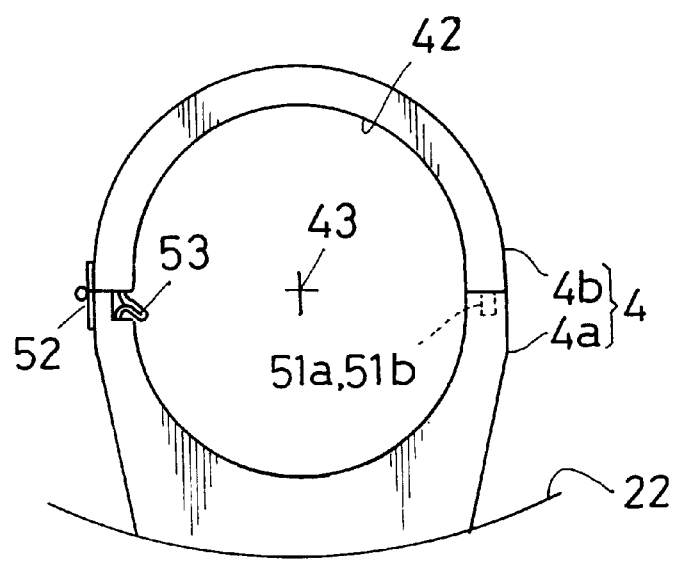

In the construction shown in FIGS. 8A and 8B, an upper lock 4b is separable from a lower block 4a set to the top board 22, while the two blocks 4a and 4b remain partly (laterally) connected through hinges 52 or the like as shown in FIG. 8A. The upper block 4b may be joined with the lower block 4a set on the top board 22 as shown in FIG. 8B. The coils in the two blocks 4a and 4b are constantly electrically connected through deformable cables 53 arranged at constantly joined sides of the blocks 4a and 4b. The two blocks 4a and 4b include connectors 51a and 51b arranged at the other sides. Thus, only when the lower block 4a and upper block 4b are joined, the coils in the respective blocks 4a and 4b are electrically connected at the other sides. (In this state, the coils in the respective blocks 4a and 4b are completely electrically connected.)

Figure 9A:
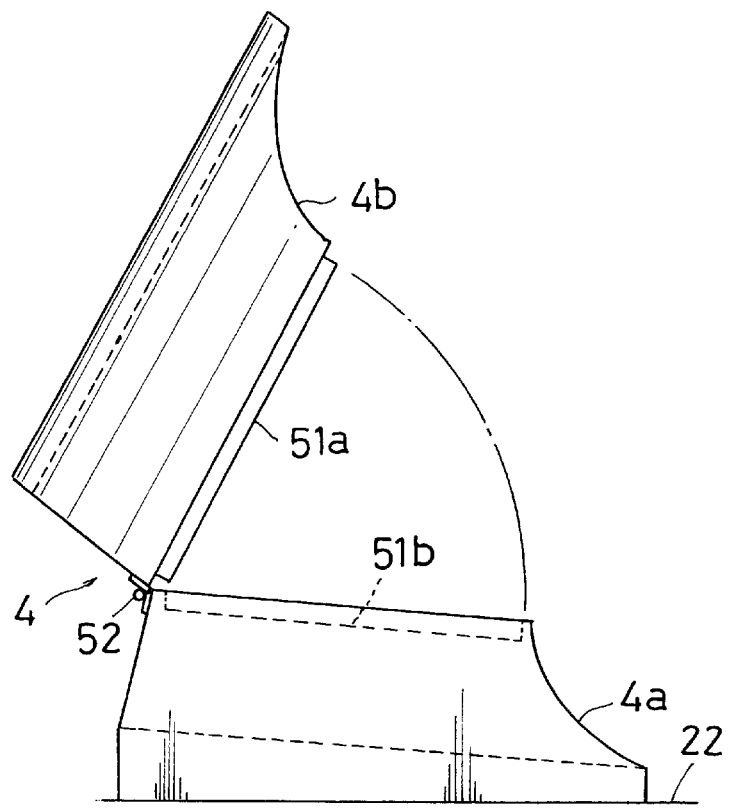
FIGS. 9A and 9B are views showing a further example of RF coil separable into two or more blocks to open a circumferential surface of the RF coil.
Figure 9B:
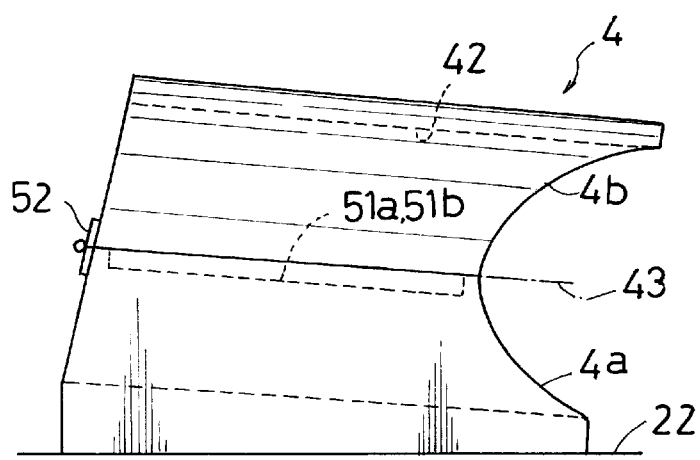

In the construction shown in FIGS. 9A and 9B, two blocks 4a and 4b are constantly connected at one end of RF coil 4.

With this construction, the upper block 4b is separable from the lower block 4a set to the top board 22 to open an area over the lower block 4a. In this state, the imaging site of examinee M is moved from above to a predetermined position on the lower block 4a. Then, the upper block 4b is joined with the lower block 4a. In this way, the imaging site of examinee M is placed in the hollow space 42 of RF coil 4. This construction facilitates the operation to insert the imaging site of examinee M into the hollow space 42 of RF coil 4, which gives no pain to the examinee M.

This invention is not limited to the RF coil designed for imaging the head and neck, but may be applied to RF coils designed for imaging the head or knees as long as the RF coils have an approximately cylindrical shape with a hollow space formed therein.

The present invention may be embodied in other specific forms without departing from the spirit or essential attributes thereof and, accordingly, reference should be made to the appended claims, rather than to the foregoing specification, as indicating the scope of the invention.

What is claimed is:

1. A magnetic resonance imaging apparatus for picking up sectional images of a predetermined imaging site of an examinee, comprising:

a gantry including various coils such as a static field coil and gradient field coils and defining an opening for receiving the examinee;

a top board for supporting the examinee in a lying down position and moving the examinee horizontally into and out of said opening;

an approximately cylindrical RF coil defining a hollow space therein;

a support member set to said top board for supporting said examinee adjacent said imaging site; and slide means for sliding said RF coil relative to said support member along an axis of said hollow space extending at an angle to a horizontal direction, wherein said slide means includes slide rails extending at said angle to said horizontal direction, and sliders formed on said RF coil to be slidable along said slide rails.

2. A magnetic resonance imaging apparatus as defined in claim 1, wherein said support member and said RF coil are attachable to and detachable from said top board.

3. A magnetic resonance imaging apparatus as defined in claim 1, wherein said RF coil is constructed for imaging the head and neck of the examinee.

* * * * *